United States Patent
Errett et al.

(10) Patent No.: US 11,573,133 B2
(45) Date of Patent: Feb. 7, 2023

(54) OPTICAL TEMPERATURE SENSOR WITH MONOLITHIC CRYSTALLINE PHOSPHOR

(71) Applicant: Advanced Energy Industries, Inc., Fort Collins, CO (US)

(72) Inventors: Jason Errett, Scotts Valley, CA (US); Terry Stapleton, San Jose, CA (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

(21) Appl. No.: 17/370,274

(22) Filed: Jul. 8, 2021

(65) Prior Publication Data

US 2023/0009000 A1 Jan. 12, 2023

(51) Int. Cl.
*G01K 11/32* (2021.01)
*H01L 21/67* (2006.01)

(52) U.S. Cl.
CPC ........ *G01K 11/32* (2013.01); *H01L 21/67248* (2013.01)

(58) Field of Classification Search
CPC .. H05H 1/0006; H05H 1/0012; H05H 1/0018; H05H 1/0025; H05H 1/0031; H05H 1/0037; H05H 1/0043; H01L 21/67248; G01K 11/32
See application file for complete search history.

(56) References Cited

U.S. PATENT DOCUMENTS

| 7,578,616 B2 | 8/2009 | Gaff et al. |
| 2020/0393308 A1* | 12/2020 | Ichihashi .......... H01L 21/67248 |

FOREIGN PATENT DOCUMENTS

TW 202018841 A 5/2020

OTHER PUBLICATIONS

Kim, Harry C., "International Search Report and Written Opinion Re International Application No. PCT/US2022/032937", dated Jul. 11, 2022, p. 7, Published in: US.

* cited by examiner

*Primary Examiner* — John Bedtelyon
(74) *Attorney, Agent, or Firm* — Neugeboren O'Dowd PC

(57) ABSTRACT

A plasma processing chamber optical temperature sensor is disclosed. The plasma processing chamber optical temperature sensor includes a light source, a light detector, and a means for transmitting light through a wall of a plasma processing chamber. An optical temperature sensing element is thermally coupled to a plasma processing chamber component within the plasma processing chamber. The optical temperature sensing element includes a monolithic crystalline phosphor element configured to be excited by light from the light source and to emit light back to the light detector indicative of a temperature of the monolithic crystalline phosphor element.

8 Claims, 3 Drawing Sheets

OPTICAL TEMPERATURE SENSOR WITH MONOLITHIC CRYSTALLINE PHOSPHOR

BACKGROUND

Field

The present disclosed embodiments relate generally to temperature sensing devices, and more specifically to crystalline, optical temperature sensing devices.

Background

Fiber optic temperature sensors hold a number of unique advantages over other temperature measuring devices, particularly when operating in the presence of strong electromagnetic fields or when measuring very low temperatures, such as down to −100° C. More specifically, fiber optic temperature sensors are well suited to measuring temperatures of plasma processing chamber components; however, the harsh environment within plasma processing chambers often limits the viability of such fiber optic temperature sensors.

Currently, fiber optic temperature sensors are typically integrated into an electrostatic chuck of a plasma processing chamber and operate outside of the harsh plasma processing chamber environment and at atmosphere. Such exterior positioning of fiber optic temperature sensors makes measuring the temperatures of individual plasma processing chamber components situated within the plasma processing chamber difficult or in some cases impossible.

In-chamber temperature monitoring may be done remotely using pyrometers along with windows or light pipes; however, variable emissivity of the components involved presents significant challenges, particularly if the components become coated with chemicals from the harsh plasma processing chamber environment, such as redeposited etch residues of an etch process. Additionally, very low temperature monitoring may be required for some plasma processes, such as −70° C. in some etch processes, for which pyrometers are ill-suited.

The in-chamber operation of many current fiber optic temperature sensors is infeasible due to the harsh environment within most plasma processing chambers. Specifically, any components of a fiber optic temperature sensor within a plasma processing chamber must be chemically resistant to the harsh environment within the plasma processing chamber and chemically compatible with the process taking place within the plasma processing chamber to maintain functionality while avoiding process contamination. For example, many current fiber optic temperature sensors fabricated using silicone, epoxy, or inorganic ceramic adhesives, which may contain known ionic contaminants (e.g., sodium, potassium, etc.), may degrade upon exposure to the plasma processing chamber environment or contaminate the process.

There is therefore a need in the art for a new optical temperature sensor design that addresses some of the current shortcomings, particularly those involved in positioning components of an optical temperature sensor within a plasma processing chamber, such as to measure temperatures of individual plasma processing chamber components.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some aspects of the present disclosure may be characterized as a plasma processing chamber optical temperature sensor that includes a light source, a light pipe configured to transmit light through a wall of a plasma processing chamber, and a light detector. An optical temperature sensing element may be thermally coupled to and embedded in a plasma processing chamber component within the plasma processing chamber. The optical temperature sensing element may include a monolithic crystalline phosphor element configured to be excited by light from the light source transmitted via the light pipe and emit light back via the light pipe to the light detector indicative of a temperature of the monolithic crystalline phosphor element.

Other aspects of the present disclosure may be characterized as a plasma processing chamber optical temperature sensor that includes a light source, a means for transmitting light through a wall of a plasma processing chamber, and a light detector. The plasma processing chamber optical temperature sensor may also include a means for thermally coupling an optical temperature sensing element to a plasma processing chamber component within the plasma processing chamber. The optical temperature sensing element may include a monolithic crystalline phosphor element configured to be excited by light from the light source transmitted via the means for transmitting light and emit light back via the means for transmitting light to the light detector indicative of a temperature of the monolithic crystalline phosphor element.

DETAILED DESCRIPTION

Figure 1:
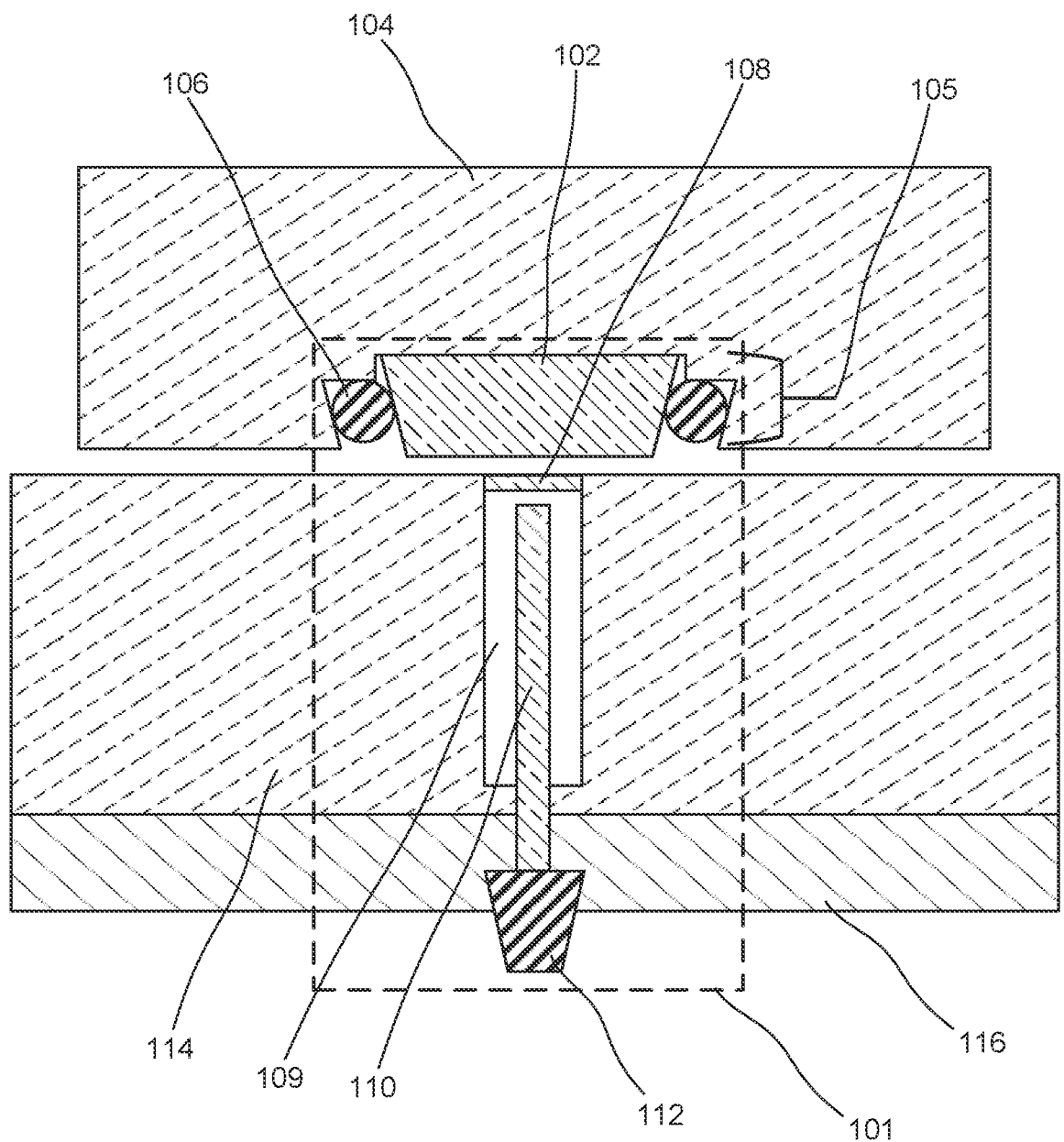
FIG. 1 illustrates a cross-sectional view of an exemplary embodiment of a plasma processing chamber optical temperature sensor with an optical temperature sensing element mechanically bonded to a plasma processing chamber component using an O-ring.

The word "exemplary" is used herein to mean "serving as an example, instance, or illustration." Any embodiment described herein as "exemplary" is not necessarily to be construed as preferred or advantageous over other embodiments.

The present disclosure may enable a highly durable plasma processing chamber optical temperature sensor to be situated within a plasma processing chamber, such as to accurately measure temperatures of individual plasma processing chamber components. Additionally, the present disclosure may enable a plasma processing chamber optical temperature sensor to be chemically resistant to the harsh environment within the plasma processing chamber and chemically compatible with a process taking place within the plasma processing chamber, thus maintaining functionality and reducing process contamination. Furthermore, the present disclosure may enable a plasma processing chamber optical temperature sensor to be highly shielded from stray light, improving temperature sensing accuracy. By implementing the apparatuses of the present disclosure, significant improvements in plasma processing chamber optical temperature sensors may be obtained, potentially enabling more reliable, durable plasma processing chamber optical temperature sensors that may accurately measure temperatures of individual plasma processing chamber components, which may be used for improved process control.

Some embodiments of the present disclosure may comprise a plasma processing chamber optical temperature sensor having a light source, a light detector, and a means for transmitting light through a wall of a plasma processing chamber. The means for transmitting light may, for example, include at least one of a light pipe, optical fiber, window, mirror, lens, light guide, and any other optical component configured to transmit light through the wall of the plasma processing chamber. The plasma processing chamber optical temperature sensor may further comprise an optical temperature sensing element and a means for thermally coupling the optical temperature sensing element to a plasma processing chamber component, such as a focus ring or showerhead electrode, within the plasma processing chamber. The means for thermally coupling may, for example, include at least one of direct contact between the optical temperature sensing element and plasma processing chamber component, such as by embedding the optical temperature sensing element within the plasma processing chamber component, a thermal interface material situated between the optical temperature sensing element and plasma processing chamber component, and close proximity of the optical temperature sensing element and plasma processing chamber component. The optical temperature sensing element may comprise a monolithic crystalline phosphor element configured to be excited by light from the light source transmitted via the means for transmitting light and emit light back via the means for transmitting light to the light detector indicative of a temperature of the monolithic crystalline phosphor element. For example, the monolithic crystalline phosphor element may be a monocrystalline or polycrystalline mass that exhibits thermally sensitive phosphorescence, such as variously doped $Al_2O_3$, yttrium aluminum garnet (YAG), spinel ($MgA_2O_4$), or any of a variety of known crystalline materials with temperature-dependent phosphorescence that has a suitable decay time. Such crystalline masses may be grown with high purity and consistency, such as through the Czochralski crystal pulling process, and may be cut into specific shapes, such as a disc, depending on the application, which may enable better mounting or retention. One or more dopants, such as chromium, europium, cerium, manganese, etc., may be selected for and included in a particular crystalline mass based, at least in part, upon phosphorescent decay time and sensitivity over a particular temperature range of a resulting doped crystalline mass. In some embodiments, the monolithic crystalline phosphor element may be a monocrystalline mass and may be oriented to minimize birefringence, such as on the c-axis for $Al_2O_3$-based, monocrystalline monolithic phosphor elements.

The monolithic crystalline phosphor element may not require the use of adhesive, binders, or encapsulation materials as with many phosphors of the prior art. Additionally, the monolithic crystalline phosphor element may exhibit advantageous material properties often associated with crystalline materials, such as excellent chemical resistance and thermal tolerance from cryogenic temperatures to well over 1000° C. Consequently, the monolithic crystalline phosphor element may be exposed to the harsh environment within the plasma processing chamber, enabling the plasma processing chamber optical temperature sensor to be chemically resistant to the harsh environment within the plasma processing chamber and chemically compatible with a process taking place within the plasma processing chamber, which may allow the plasma processing chamber optical temperature sensor to be situated within the plasma processing chamber and accurately measure temperatures of individual plasma processing chamber components.

In some embodiments, the plasma processing chamber optical temperature sensor may comprise a means for mechanically bonding the optical temperature sensing element to the plasma processing chamber component. The means for mechanically bonding may include at least one of an O-ring and a retention ring. For example, the optical temperature sensing element may be embedded in the plasma processing chamber component, such as by being situated within a recess of the plasma processing chamber component, and retained, or held in place, using an O-ring, forming a mechanical bond. The O-ring may comprise a compressible, elastomeric material that is capable of withstanding the environment within the plasma processing chamber, such as a fluoroelastomer, high-performance silicone, or fluoropolymer-encapsulated silicone, which may enable the optical temperature sensing element to be retained even with differential thermal expansion and easily removed for reconditioning, such as by tumble polishing, and reuse in another plasma processing chamber component.

In another example, the optical temperature sensing element may be embedded in the plasma processing chamber component, such as by being situated within a recess of the plasma processing chamber component, and retained using a retention ring, forming a mechanical bond. The retention ring may be fabricated from a same material as the plasma processing chamber component, such as SiC or Si, and sized to permit differential thermal expansion of the plasma processing chamber component and the optical temperature sensing element. The retention ring may be at least one of welded and brazed to the plasma processing chamber component, such as through filler-free laser welding or welding with filler materials compatible with a plasma process taking place within the plasma processing chamber. The retention ring may enable the mechanical bonding of the optical temperature sensing element to the plasma processing chamber component in applications where the elastomeric material of the O-ring is not compatible with the plasma process, such as chemically or thermally.

In some embodiments, the plasma processing chamber optical temperature sensor may, optionally, comprise a means for providing a compressible thermal interface between the optical temperature sensing element and the plasma processing chamber component. The means for providing the compressible thermal interface may include a compressible pyrolytic graphite thermal interface material or other compressible thermal interface material, which is compatible with a plasma process taking place within the plasma processing chamber, situated between the optical temperature sensing element and the plasma processing chamber component. For example, in the retention ring example discussed above, a compressible pyrolytic graphite thermal interface material may be situated between the optical temperature sensing element and the plasma processing chamber component, which may help compensate for differential thermal expansion of the plasma processing chamber component and the optical temperature sensing element, potentially filling any gaps between the two and enhancing thermal coupling.

In some embodiments, the plasma processing chamber optical temperature sensor may comprise a means for directly joining the monolithic crystalline phosphor element of the optical temperature sensing element and the plasma processing chamber component. The means for directly joining may include laser welding the monolithic crystalline phosphor element to the plasma processing chamber component. For example, the optical temperature sensing element may be embedded in the plasma processing chamber component, such as by being situated within a recess of the plasma processing chamber component, and the monolithic crystalline phosphor element may be directly laser welded to the plasma processing chamber component, such as along the perimeter of the recess. The optical temperature sensing element may have a matching thermal expansion coefficient to the plasma processing chamber component, such as a ruby optical temperature sensing element and a sintered alumina ceramic plasma processing chamber component, and may be configured to directly interface with each wall of the recess across a wide range of temperatures, providing a robust thermal coupling and enabling retention of the optical temperature sensing element without additional components, such as an O-ring or a retention ring.

In some embodiments, the plasma processing chamber optical temperature sensor may be highly shielded from stray light, improving temperature sensing accuracy. For example, the optical temperature sensing element may be embedded in the plasma processing chamber component, providing light shielding on all non-exposed sides, and be configured so that any exposed sides face a wall of the plasma processing chamber, potentially reducing stray light from a plasma process taking place within the plasma processing chamber. In another example, the means for transmitting light through a wall of a plasma processing chamber may be shielded from stray light within the plasma processing chamber, such as through positioning behind the plasma processing chamber component, as well as from stray light (e.g., ambient light) external to the plasma processing chamber, such as through encapsulation or coatings known in the art to provide light shielding. Such shielding from stray light may improve temperature sensing accuracy by reducing stray light excitation of the monolithic crystalline phosphor element and reducing stray light transmission to the light detector. Additionally, the monolithic crystalline phosphor element may comprise narrow band emitting materials, such as ruby, which may enable the use of narrow bandpass filters to help reduce the effect of stray light on the light detector, providing more accurate temperature measurements. Furthermore, fault detection algorithms or other methods of filtering noisy data may be implemented to mitigate errors introduced by stray light.

Referring now to the drawings, FIG. 1 illustrates a cross-sectional view of an exemplary embodiment of a plasma processing chamber optical temperature sensor 101 with an optical temperature sensing element 102 mechanically bonded to a plasma processing chamber component 104 using an O-ring 106. The plasma processing chamber optical temperature sensor 101 may have a light source (not shown) and a light detector (not shown) as well as a light pipe 110 configured to transmit light through a wall 116 of a plasma processing chamber. The light source may be situated outside of the plasma chamber and may be configured to emit light that is transmitted via the light pipe 110 to the optical temperature sensing element 102, which may comprise a monolithic crystalline phosphor element. The light detector may also be situated outside of the plasma chamber and may be configured to receive light emitted by the monolithic crystalline phosphor element of the optical temperature sensing element 102 via the light pipe 110. In some embodiments, additional optical elements, such as an optical fiber, may optically connect the light pipe 110 to the light source and light detector.

The optical temperature sensing element 102 may be thermally coupled to, via direct contact, and embedded in the plasma processing chamber component 104 within the plasma processing chamber. The plasma processing chamber component 104 may be any component within the plasma processing chamber, such as a focus ring or showerhead electrode, and may, for example, be constructed of silicon, silicon carbide, or a sintered alumina ceramic. As shown, the optical temperature sensing element 102 may be situated in a recess 105 of the plasma processing chamber component 104. The recess 105 may be roughly cylindrical with a circumferential lip having a tapered wall configured to receive and retain the O-ring 106. The optical temperature sensing element 102 may have a tapered cylinder shape and may be configured to directly interface with a bottom wall of the recess 105, providing a thermal coupling. The O-ring 106 may be wedged between a side wall of the optical temperature sensing element 102 and the tapered wall of the circumferential lip, retaining and mechanically bonding the optical temperature sensing element 102 to the plasma processing chamber component 104. A small gap may remain between the side wall of the optical temperature sensing element 102 and one or more side walls of the recess 105, allowing for differential thermal expansion of the optical temperature sensing element 102 and the plasma processing chamber component 104. The O-ring 106 may comprise a compressible, elastomeric material that is capable of withstanding an environment within the plasma processing chamber, such as a fluoroelastomer, high-performance silicone, or fluoropolymer-encapsulated silicone, which may enable the optical temperature sensing element 102 to be retained even with differential thermal expansion and easily removed for reconditioning, such as by tumble polishing, and reuse in another plasma processing chamber component. Although the optical temperature sensing element 102 and the recess 105 are shown to be roughly cylindrical, it is contemplated that other geometries, such as cuboid, pyramidal, etc., and configurations for O-ring retention, such as a notch rather than the tapered wall of the circumferential lip, may be used without departing from the scope of the present disclosure.

The monolithic crystalline phosphor element of the optical temperature sensing element 102 may be configured to be excited by light from the light source transmitted via the light pipe 110 and emit light back via the light pipe 110 to the light detector indicative of a temperature of the monolithic crystalline phosphor element. For example, the light source may emit light that is directed to the light pipe 110, such as via an optical fiber or direct line-of-sight. The light pipe 110 may then transmit the light from the light source to the monolithic crystalline phosphor element of the optical temperature sensing element 102, exciting the monolithic crystalline phosphor element, which then emits light. The light emitted by the monolithic crystalline phosphor element depends on a temperature of the monolithic crystalline phosphor element, which may be thermally coupled to the plasma processing chamber component 104 as a component of the optical temperature sensing element 102. The light pipe 110 may then transmit the light emitted by the monolithic crystalline phosphor element to the light detector, such as via an optical fiber or direct line-of-sight. The light detector may interpret the light emitted by the monolithic crystalline phosphor element to determine the temperature of the monolithic crystalline phosphor element, which may be used, due to thermal coupling, to determine the temperature of the plasma processing chamber component 104.

The light pipe 110 may pass through a vacuum seal feedthrough interface 112 as well as a wall shielding layer 114 and the wall 116 of the plasma processing chamber to access the interior of the plasma processing chamber. The vacuum seal feedthrough interface 112 may be integrated into the wall 116 and may provide an airtight seal for the plasma processing chamber while allowing the light pipe 110 access. Additionally, the vacuum seal feedthrough interface 112 may, for example, provide an interface and optical connection, via a central hole, for the light pipe 110 and an optical fiber that aids in transmitting light from the light source and to the light detector. The light pipe 110 may be situated in a well 109 of the wall shielding layer 114, extending towards the optical temperature sensing element 102 but leaving a gap between the optical temperature sensing element 102 and the light pipe 110. The light pipe 110 may be constructed without the use of binders, adhesives, or encapsulation materials, such as a sapphire light pipe, which has excellent chemical resistance. Optionally, a window 108 may cap the well 109, isolating the light pipe 110 from the environment within the plasma processing chamber and protecting the light pipe 110. However, inclusion of the window 108 may depend on any chemicals or residues potentially present within the plasma processing chamber. For example, the window 108 may not be included in more harsh environments due to potential problems, such as those related to chemical residue deposition affecting emissivity as discussed above.

In other embodiments, the light pipe 110 may be replaced with other means for transmitting light, such as an encapsulated optical fiber, window, lens, light guide, or any other optical component configured to transmit light through the wall shielding layer 114 and the wall 116 of the plasma processing chamber; however, such optical components may introduce problems with harsher plasma processing chamber environments. For example, encapsulation material around an optical fiber may degrade under harsh conditions and potentially contaminate the plasma processing chamber. Additionally, other well configurations, such as narrow hole, and means for providing an airtight seal, such as gaskets or welding techniques, may be implemented without departing from the scope of the present disclosure.

The optical temperature sensing element 102 shown is comprised entirely of the monolithic crystalline phosphor element; however, it is contemplated that, in other embodiments, the optical temperature sensing element 102 may comprise other components, such as mounting brackets, housing for the monolithic crystalline phosphor element, light shielding elements, etc., without departing from the scope of the present disclosure.

In some embodiments, the monolithic crystalline phosphor element of the optical temperature sensing element 102 may be a monocrystalline mass exhibiting thermally sensitive phosphorescence or, alternatively, a polycrystalline mass exhibiting thermally sensitive phosphorescence. For example, the monolithic crystalline phosphor element may be a monolithic crystalline mass of variously doped $Al_2O_3$, yttrium aluminum garnet (YAG), spinel ($MgAl_2O_4$), or any of a variety of known crystalline materials with temperature-dependent phosphorescence that has a suitable decay time. One or more dopants, such as chromium, europium, cerium, manganese, etc., may be selected for and included in a particular monolithic crystalline mass based, at least in part, upon phosphorescent decay time and sensitivity over a particular temperature range of a resulting doped monolithic crystalline mass. Birefringence associated with such crystalline materials, particularly in monocrystalline form, may be mitigated by, for example, orienting the monolithic crystalline phosphor element to minimize birefringence, such as on the c-axis for $Al_2O_3$-based, monocrystalline monolithic phosphor elements. Such crystalline materials exhibit excellent chemical resistance and thermal tolerance from cryogenic temperatures to well over 1000° C., and the monolithic form of such monolithic crystalline masses may enable the monolithic crystalline phosphor element to be implemented without the use of adhesive, binders, or encapsulation materials, avoiding some problematic aspects of the prior art associated with phosphor composition and chemical deposition onto components within the plasma processing chamber. Consequently, the monolithic crystalline phosphor element may be directly exposed to the harsh environment within the plasma processing chamber, enabling the optical temperature sensing element 102 to be situated within the plasma processing chamber while being chemically resistant to the harsh environment within the plasma processing chamber and chemically compatible with a process taking place within the plasma processing chamber. Positioning the optical temperature sensing element 102 within the plasma processing chamber may enable superior thermal coupling, such as via direct contact, with an individual plasma processing chamber component, such as the plasma processing chamber component 104, enabling accurate temperature measurement of individual plasma processing chamber components to be made.

In some embodiments, the plasma processing chamber optical temperature sensor 101 may be highly shielded from stray light, improving temperature sensing accuracy. The optical temperature sensing element 102 may be embedded in the plasma processing chamber component 104, providing light shielding on all non-exposed sides. Additionally, any exposed sides of the optical temperature sensing element 102 may face the wall shielding layer 114 of the plasma processing chamber, and the optical temperature sensing element 102 may be embedded in a portion of the plasma processing chamber component 104 in close proximity to the wall shielding layer 114, as shown. Consequently, the plasma processing chamber component 104 may block a large proportion of the stray light produced by a plasma process taking place within the plasma processing chamber. Furthermore, the light pipe 110 may be positioned behind the plasma processing chamber component 104, shielding the light pipe 110 from stray light produced in the plasma processing chamber, and an external portion of the light pipe 110 may be encapsulated by the vacuum seal feedthrough interface 112, shielding the light pipe 110 from external stray light while providing access to the light source and the light detector. Such shielding from stray light may improve temperature sensing accuracy by reducing stray light excitation of the monolithic crystalline phosphor element and reducing stray light transmission to the light detector.

Figure 2:
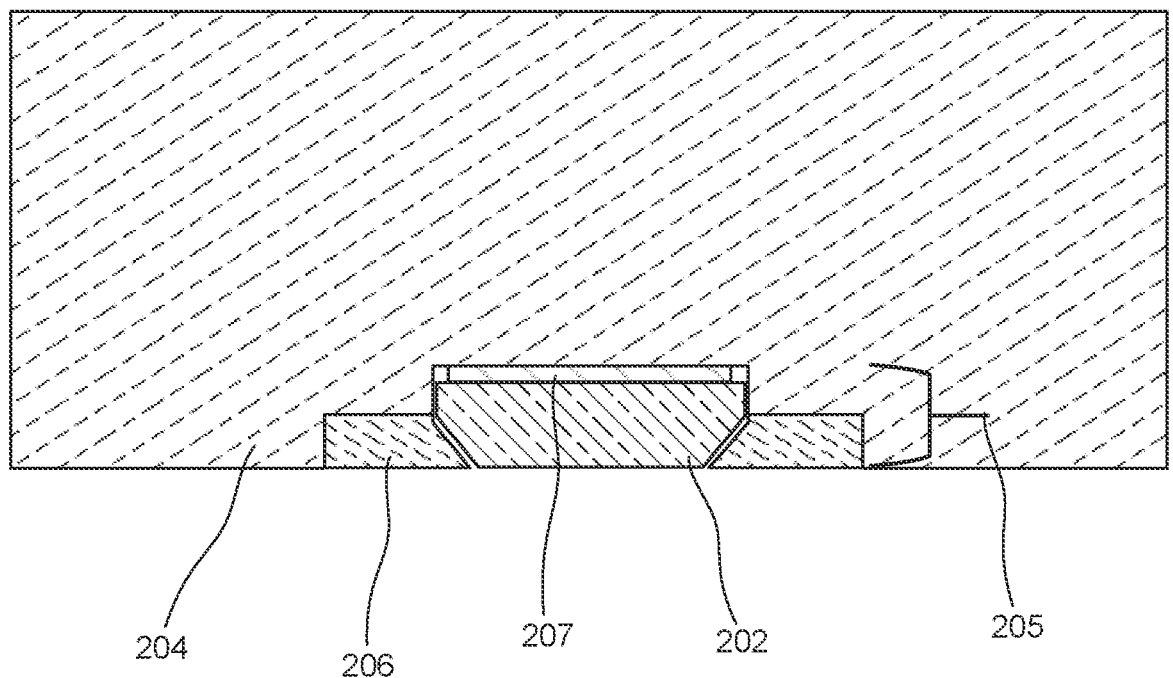
FIG. 2 illustrates a cross-sectional view of an exemplary embodiment of an in-chamber portion of a plasma processing chamber optical temperature sensor with an optical temperature sensing element mechanically bonded to a plasma processing chamber component using a retention ring.

Referring now to FIG. 2, illustrated is a cross-sectional view of an exemplary embodiment of an in-chamber portion of a plasma processing chamber optical temperature sensor with an optical temperature sensing element 202 mechanically bonded to a plasma processing chamber component 204 within a recess 205 of the plasma processing chamber component 204 using a retention ring 206. The plasma processing chamber optical temperature sensor of FIG. 2 may be substantially the same as the plasma processing chamber optical temperature sensor 101 of FIG. 1, except the optical temperature sensing element 202, plasma processing chamber component 204, and recess 205 are configured for the retention ring 206, rather than the O-ring 106, and a compressible thermal interface material 207 is optionally included.

The optical temperature sensing element 202 may be thermally coupled to and embedded in the plasma processing chamber component 204 within the plasma processing chamber. The thermal coupling of the optical temperature sensing element 202 and plasma processing chamber component 204 may be via direct contact, close proximity, or, optionally, via the compressible thermal interface material 207. The optical temperature sensing element 202 may be situated in the recess 205 of the plasma processing chamber component 204, and the recess 205 may be roughly cylindrical with a circumferential lip configured to receive the retention ring 206. The optical temperature sensing element 202 may have a cylindrical shape at one end and a tapered cylindrical shape at another end configured to interface with the retention ring 206. The optical temperature sensing element 202 shown is comprised entirely of a monolithic crystalline phosphor element; however, in other embodiments, the optical temperature sensing element 202 may comprise of other components.

The retention ring 206 may be roughly ring-shaped with a tapered interior wall configured to interface with the plasma processing chamber component 204. The retention ring 206 may be seated on the circumferential lip and affixed to the plasma processing chamber component 204, retaining and mechanically bonding the optical temperature sensing element 202 to the plasma processing chamber component 204. For example, the retention ring 206 may be at least one of welded and brazed to the plasma processing chamber component 204, such as through filler-free laser welding or welding with filler materials compatible with a particular plasma process taking place within the plasma processing chamber. A small gap may remain between the optical temperature sensing element 202 and one or more walls of the recess 205, allowing for differential thermal expansion of the optical temperature sensing element 202 and the plasma processing chamber component 204. The retention ring 206 may be fabricated from a same material as the plasma processing chamber component 204, such as silicon, silicon carbide, or a sintered alumina ceramic, and sized to permit differential thermal expansion of the plasma processing chamber component 204 and the optical temperature sensing element 202, in some configurations leaving a small gap between the retention ring 206 and the optical temperature sensing element 202. The retention ring 206 may enable the mechanical bonding of the optical temperature sensing element 202 to the plasma processing chamber component 204 in applications where the elastomeric material of an O-ring is incompatible with a particular plasma process, such as chemically or thermally.

Optionally, the compressible thermal interface material 207 may be situated between the optical temperature sensing element 202 and the plasma processing chamber component 204. For example, the compressible thermal interface material 207 may be a compressible pyrolytic graphite thermal interface material, or other compressible thermal interface material that is compatible with a plasma process taking place within the plasma processing chamber, and the compressible thermal interface material 207 may be shaped into a disk and situated between a bottom wall of the recess 205 and one end of the optical temperature sensing element 202. The compressible thermal interface material 207 may help compensate for differential thermal expansion of the plasma processing chamber component 204 and the optical temperature sensing element 202, such as by compressively filling gaps between the two, enhancing thermal coupling.

Although the optical temperature sensing element 202 and the recess 205 are shown to be roughly cylindrical, it is contemplated that other geometries, such as cuboid, pyramidal, etc., and retention ring 206 configurations, such as a retaining circular plate with a plurality of holes or a retention ring integrated into the optical temperature sensing element 202, may be used without departing from the scope of the present disclosure.

Figure 3:
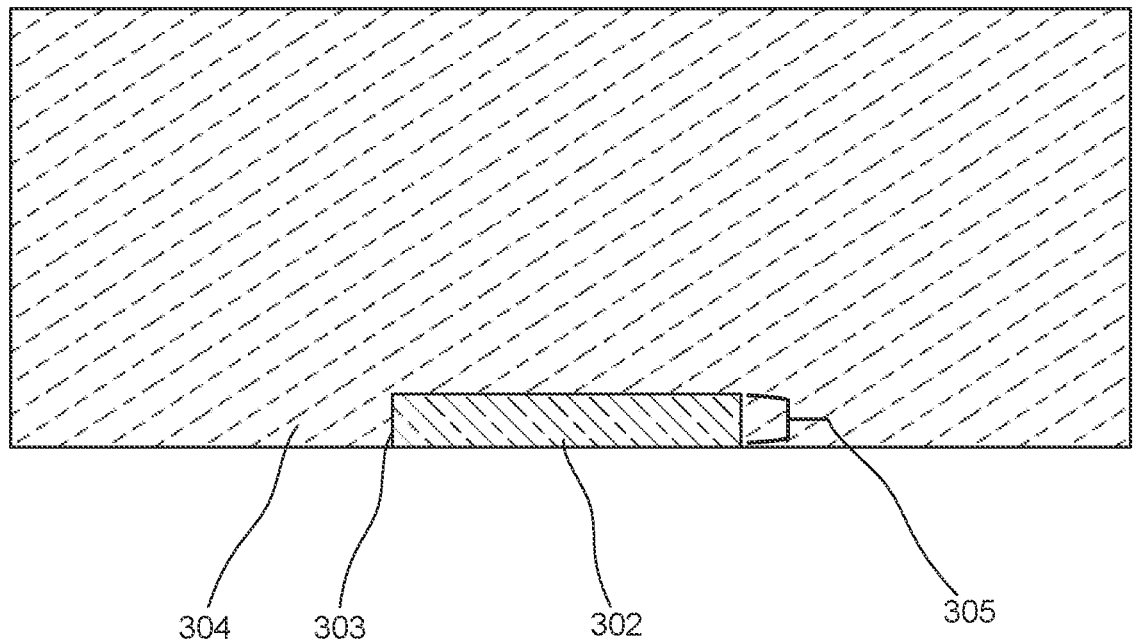
FIG. 3 illustrates a cross-sectional view of an exemplary embodiment of an in-chamber portion of a plasma processing chamber optical temperature sensor with an optical temperature sensing element directly joined to a plasma processing chamber component.

Referring now to FIG. 3, illustrated is a cross-sectional view of an exemplary embodiment of an in-chamber portion of a plasma processing chamber optical temperature sensor with an optical temperature sensing element 302 directly joined to a plasma processing chamber component 304 within a recess 305 of the plasma processing chamber component 304. The plasma processing chamber optical temperature sensor of FIG. 3 may be substantially the same as the plasma processing chamber optical temperature sensor 101 of FIG. 1, except the optical temperature sensing element 302, plasma processing chamber component 304, and recess 305 are configured for direct joining without the O-ring 106.

The optical temperature sensing element 302 may be thermally coupled to and embedded in the plasma processing chamber component 304 within the plasma processing chamber. The thermal coupling of the optical temperature sensing element 302 and plasma processing chamber component 304 may be via direct contact. The optical temperature sensing element 302 may be configured to be situated in the recess 305 of the plasma processing chamber component 304 and directly joined to the plasma processing chamber component 304, such as through directly joining a monolithic crystalline phosphor element of the optical temperature sensing element 302 to the plasma processing chamber component 304. For example, the monolithic crystalline phosphor element of the optical temperature sensing element 302 may be laser welded directly to the plasma processing chamber component 304, such as along a perimeter 303 of the recess 305. The optical temperature sensing element 302 shown is comprised entirely of a monolithic crystalline phosphor element; however, in other embodiments, the optical temperature sensing element 302 may comprise of other components.

The optical temperature sensing element 302 and recess 305 may be configured to maintain contact, and thus good thermal coupling, across a wide range of temperatures. For example, the optical temperature sensing element 302 and recess 305 may each have a matching cylindrical shape and a matching thermal expansion coefficient so that each wall of the optical temperature sensing element 302 that faces the recess 305 maintains contact with the recess 305. The material of the optical temperature sensing element 302 and the monolithic crystalline phosphor element may be chosen to match the thermal expansion coefficient of the plasma processing chamber component 304, such as a ruby optical temperature sensing element and monolithic crystalline phosphor element to match the thermal expansion coefficient of a sintered alumina ceramic plasma processing chamber component. Such a direct joining of the optical temperature sensing element 302 and the plasma processing chamber component 304 may enable a robust thermal coupling and may enable retention of the optical temperature sensing element 302 without additional components, such as an O-ring or a retention ring. Other optical temperature sensing element and recess geometries, such as cuboid, pyramidal, etc., may be used in other embodiments without departing from the scope of the present disclosure.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A plasma processing chamber optical temperature sensor comprising:
    a light source;
    a light pipe configured to transmit light through a wall of a plasma processing chamber;
    a light detector; and
    an optical temperature sensing element with a tapered cylinder shape thermally coupled, via direct contact, to a bottom wall of a recess of a plasma processing chamber component within the plasma processing chamber, and the optical temperature sensing element is embedded in the recess of the plasma processing chamber component within the plasma processing chamber, the recess having a tapered wall;
    an O-ring positioned between the tapered wall of the recess and a side wall of the optical temperature sensing element; and
    the optical temperature sensing element comprising a monolithic crystalline phosphor element configured to be excited by light from the light source transmitted via the light pipe and to emit light back via the light pipe to the light detector indicative of a temperature of the monolithic crystalline phosphor element.

2. The plasma processing chamber optical temperature sensor of claim 1, wherein a compressible thermal interface material is situated between the optical temperature sensing element and the plasma processing chamber component.

3. The plasma processing chamber optical temperature sensor of claim 1, wherein the monolithic crystalline phosphor element is a monocrystalline mass exhibiting thermally sensitive phosphorescence.

4. The plasma processing chamber optical temperature sensor of claim 1, wherein the monolithic crystalline phosphor element is a polycrystalline mass exhibiting thermally sensitive phosphorescence.

5. A plasma processing chamber optical temperature sensor comprising:
    a light source;
    means for transmitting light through a wall of a plasma processing chamber;
    a light detector;
    a monocrystalline mass sensing element exhibiting thermally sensitive phosphorescence, the monocrystalline mass sensing element comprising a cylindrical shape at one end and a tapered cylindrical shape at another end, the monocrystalline mass sensing element thermally coupled to a bottom wall of a recess of a plasma processing chamber component within the plasma processing chamber, and the monocrystalline mass sensing element is embedded in the recess of the plasma processing chamber component within the plasma processing chamber, the recess having a cylindrical wall; and
    a retention ring bonded at one end to the recess and comprising a tapered interior wall to overlap the tapered cylindrical shape of the monocrystalline mass sensing element.

6. The plasma processing chamber optical temperature sensor of claim 5, wherein the retention ring is at least one of welded and brazed to the plasma processing chamber component.

7. The plasma processing chamber optical temperature sensor of claim 5 further comprising:
    means for providing a compressible thermal interface between the monocrystalline mass sensing element and the plasma processing chamber component.

8. The plasma processing chamber optical temperature sensor of claim 5 further comprising:
    means for directly joining the monocrystalline mass sensing element and the plasma processing chamber component.

* * * * *